United States Patent
Haq et al.

(10) Patent No.: US 10,570,659 B2
(45) Date of Patent: Feb. 25, 2020

(54) METHOD OF MAKING ELECTRO-OPTIC WINDOW BY SPUTTERING MATERIAL TO FILL CHANNELS OF A GRID

(71) Applicant: BAE Systems plc, London (GB)

(72) Inventors: Sajad Haq, South Gloucestershire (GB); Hazel Anne Dyke, South Gloucestershire (GB); Michael Dunleavy, South Gloucestershire (GB); Harry John Finn, Lancashire (GB)

(73) Assignee: BAE Systems plc, London (GB)

( * ) Notice: Subject to any disclaimer, the term of this patent is extended or adjusted under 35 U.S.C. 154(b) by 510 days.

(21) Appl. No.: 15/314,652

(22) PCT Filed: Feb. 2, 2015

(86) PCT No.: PCT/GB2015/050261
§ 371 (c)(1),
(2) Date: Nov. 29, 2016

(87) PCT Pub. No.: WO2015/189553
PCT Pub. Date: Dec. 17, 2015

(65) Prior Publication Data
US 2017/0191308 A1     Jul. 6, 2017

(30) Foreign Application Priority Data

Jun. 12, 2014   (EP) .................................... 14275136
Jun. 12, 2014   (GB) ................................... 1410447.5

(51) Int. Cl.
*E06B 5/18*      (2006.01)
*G02B 5/20*      (2006.01)
(Continued)

(52) U.S. Cl.
CPC ................. *E06B 5/18* (2013.01); *G02B 5/20* (2013.01); *H01Q 1/52* (2013.01); *H01Q 5/22* (2015.01);
(Continued)

(58) Field of Classification Search
CPC ........ B32B 17/10146; B32B 17/10192; B32B 17/10403; B32B 17/10449;
(Continued)

(56) References Cited

U.S. PATENT DOCUMENTS 5,194,985 A * 3/1993 Hilton, Sr. ............ G02B 1/105
                                                        359/350
5,481,400 A * 1/1996 Borden ............ H01L 31/02164
                                                        219/203
(Continued)

FOREIGN PATENT DOCUMENTS

DE    3643704 A1    6/1988
DE    3643704 A1    6/1998
(Continued)

OTHER PUBLICATIONS

International Search Report and Written Opinion of PCT/GB2015/050261 dated Mar. 23, 2015, 13 pages.
(Continued)

*Primary Examiner* — Ryan S Dunning
(74) *Attorney, Agent, or Firm* — Maine Cernota & Rardin

(57) ABSTRACT

An electro-optic window is provided, together with a method of manufacturing the window. The window (3) is made of a material substantially transparent to at least one of infra-red, visible and UV radiation and treated to have reduced RF/MICROWAVE transmission characteristics by the provision of a grid (1) set into at least one surface (2)
(Continued)

thereof. The grid (1) is formed of a material selected to be either reflective or absorptive to RF/MICROWAVE radiation.

6 Claims, 12 Drawing Sheets

(51) Int. Cl.
| | |
|---|---|
| *H01Q 1/52* | (2006.01) |
| *H01Q 15/00* | (2006.01) |
| *H01Q 17/00* | (2006.01) |
| *H05K 9/00* | (2006.01) |
| *H01Q 5/22* | (2015.01) |
| *B32B 17/10* | (2006.01) |
| *G21F 7/03* | (2006.01) |

(52) U.S. Cl.
CPC ......... *H01Q 15/0013* (2013.01); *H01Q 17/00* (2013.01); *H05K 9/0005* (2013.01); *B32B 17/10146* (2013.01); *B32B 17/10192* (2013.01); *B32B 17/10403* (2013.01); *B32B 17/10449* (2013.01); *G02B 5/204* (2013.01); *G21F 7/03* (2013.01); *H01Q 1/526* (2013.01); *H01Q 17/002* (2013.01)

(58) Field of Classification Search
CPC ............... C23C 18/1639; C23C 18/54; E04B 2001/925; E06B 5/18; G02B 5/20; G02B 5/204; G02B 5/22; G02B 5/24; G02B 5/26; G02F 2203/055; G21F 1/06; G21F 7/03; H01Q 1/425; H01Q 1/52; H01Q 1/526; H01Q 5/22; H01Q 15/0013; H01Q 17/00; H01Q 17/002; H01Q 17/004; H01Q 17/008; H05K 9/0005
USPC ............... 174/392, 393; 204/192.22, 192.26, 204/192.27, 192.28, 298.04; 216/31, 39, 216/80, 97; 244/129.3, 171.7; 250/515.1, 517.1; 359/350, 358, 359, 359/360, 361, 577, 580, 582, 584, 585, 359/589; 427/162, 163.1, 164, 165, 166, 427/168; 428/34, 67, 304.4, 305.5, 320.2, 428/321.1, 321.5, 432
See application file for complete search history.

(56) References Cited

U.S. PATENT DOCUMENTS

| | | | | |
|---|---|---|---|---|
| 5,595,943 | A * | 1/1997 | Itabashi | C23C 18/36 257/E21.174 |
| 5,776,612 | A | 7/1998 | Fisher | |
| 5,858,496 | A * | 1/1999 | Fisher | H05B 3/86 219/203 |
| 6,028,699 | A | 2/2000 | Fisher | |
| 6,103,033 | A * | 8/2000 | Say | A61B 5/14532 156/73.1 |
| 6,852,420 | B2 * | 2/2005 | Yamamoto | C03C 27/00 249/114.1 |
| 7,350,753 | B2 * | 4/2008 | Guidon | B64C 1/1484 244/129.1 |
| 8,395,059 | B2 * | 3/2013 | Miyazaki | H05K 9/0096 156/60 |
| 2003/0042045 | A1 | 3/2003 | Koskenmaki | |
| 2005/0017905 | A1 | 1/2005 | Rawnick | |
| 2009/0128893 | A1 * | 5/2009 | McCarthy | G02B 5/1861 359/352 |
| 2011/0109519 | A1 | 5/2011 | Quan | |
| 2014/0054067 | A1 | 2/2014 | Heikenfeld | |

FOREIGN PATENT DOCUMENTS

| | | |
|---|---|---|
| EP | 2009976 A1 | 12/2008 |
| JP | 2000054755 A | 2/2000 |

OTHER PUBLICATIONS

Great Britain Search Report of Application No. GB1410447.5, dated Dec. 23, 2014, 3 pages.
Extended European Search Report of Application No. EP14275136, dated Dec. 1, 2014, 8 pages.
International Preliminary Report on Patentability for Appl No. PCT/GB2015/050261 dated Dec. 22, 2016, 10 pages.

* cited by examiner

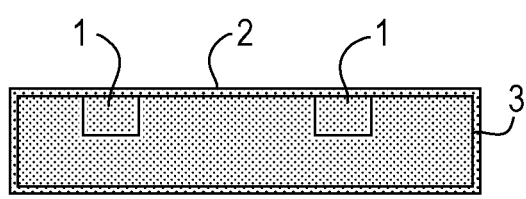
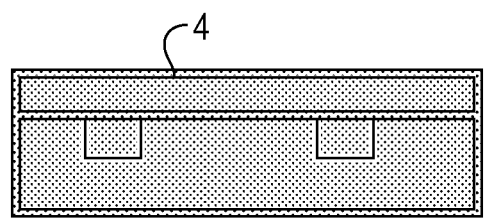
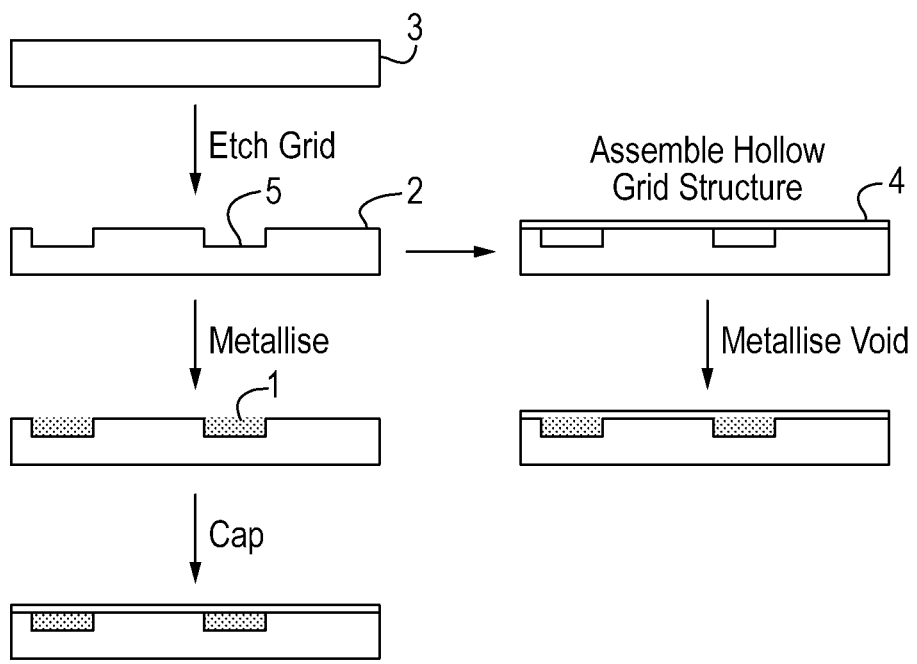

Coating on Silicon Wafer (Heat Treated)

Coating on Silicon sapphire (Heat Treated)

Light reflected from a section of Si wafer spray-coated with MgAl spinel precursor (& dried at 70C). Area at top of sample was masked prior to coating A sample after thermal treatment

METHOD OF MAKING ELECTRO-OPTIC WINDOW BY SPUTTERING MATERIAL TO FILL CHANNELS OF A GRID

RELATED APPLICATIONS

This application is a national phase application filed under 35 USC § 371 of PCT Application No. PCT/GB2015/050261 with an International filing date of Feb. 2, 2015 which claims priority of GB Patent Application 1410447.5 filed Jun. 12, 2014 and EP Patent Application 14275136.1 filed Jun. 12, 2014. Each of these applications is herein incorporated by reference in its entirety for all purposes.

FIELD OF THE INVENTION

This invention relates to electro-optic (EO) windows which pass radiation in the infra-red waveband and/or optical and/or UV bands but which either absorb or reflect RF/microwave radiation and to methods of their production.

BACKGROUND OF THE INVENTION

There are many applications where an infra-red transparent window is positioned in the optical path of EO equipment to protect the equipment during use. Where such windows are used on military vehicles, they can give unwanted radar returns if they pass a substantial proportion of any incident RF transmission, and particularly in the microwave band, which is understood to refer to radiation in the waveband of from a few MHz—300 GHz. This places stringent design criteria on the window so that it transmits in the infra-red and preferably also the visible spectral bands but does not transmit microwaves. The term 'window' is used broadly herein to mean an element capable of transmitting radiation in the optical and/or infra-red wavebands, said window being with or without optical power, and so includes lenses as well as refractive and diffractive elements generally. The term 'transparent' is used to mean that the window transmits a usable amount of radiation at the mid value of the infra-red and/or optical wavebands.

In order to provide low RF/MICROWAVE transmission infra-red windows it is known to apply a metal mesh or grid to the surface of the window. However, the metal mesh may have the drawback that, where the window is exposed to the environment, to air, water or sand abrasion, the thickness of the metal mesh can deflect water droplets or sand particles so as to accelerate abrasion of the window.

In some current applications, zinc sulphide windows that exhibit low RF/MICROWAVE transmission are used in EO sensors. Current designs incorporate fine metal grids close to the surfaces of the zinc sulphide windows in order to reflect microwave radiation. The bulk zinc sulphide windows are manufactured by chemical vapour deposition and the grid is then produced by sputtering/chemical vapour deposition onto the surface of the window, so producing large areas is a problem. Such designs are not cost effective; it is difficult to ensure uniformity of the metal grids, and there is a high risk of environmental damage to the metal grids.

Encapsulation of the grids by overgrowing with ZnS may circumvent the problems of environmental degradation, but this also suffers from scale-up difficulties and from induced defects in the surface topography caused by the grid sitting proud of the window surface and delamination or weaknesses at the interfaces. This problem can therefore create the need for additional post-fabrication machining or polishing in order to flatten the outer surface of the grown on ZnS.

SUMMARY OF THE INVENTION

Accordingly, it is an object of the present invention to overcome or reduce some of the above mentioned drawbacks.

According to one aspect of the invention there is provided an EO window made of a material substantially transparent to at least one of infra-red, visible and UV radiation and treated to have reduced RF/MICROWAVE transmission characteristics by the provision of a grid pattern set into a surface thereof the grid being formed of a material selected to be one of reflective and absorptive to RF/MICROWAVE radiation.

It is to be understood that the use of the term "grid" herein is to be interpreted to include a frequency selective pattern.

In another aspect, this invention provides a method of making an electro-optic window formed from a material substantially transparent to at least one of infra-red, visible and UV radiation whereby to render the window capable of reduced RF/MICROWAVE transmission characteristics, the method including the steps of forming on a surface of the window a grid of channels, creating a corresponding grid pattern of a material having one of electrically conductive and dielectric properties within the channels whereby to render the window non transmissive to RF/MICROWAVE radiation and treating the material as required to render the grid usable to reduce the RF/MICROWAVE transmission characteristics of the window.

It will be appreciated that more than one window may be used, to form a "stack" of windows attached to one another.

More than one window may include a said grid and each window may have a grid set into more than one surface thereof, for example into opposed surfaces thereof.

The grid may be set into channels in the window whereby to fill the channels no more than substantially flush with the said surface of the window. If the grid is flush with the surface of the window, then a smooth surface will be offered to any cover layer or to the atmosphere, if the window is to be used without a cover. The effect of the channels not being entirely filled with the grid material may be advantageous in that the grid may then effectively form a micro-structured surface having an anti-reflection effect.

The electro-optic window may include a capping layer covering the grid and attached to the said window surface. Such a capping layer will offer protection from weather erosion.

The capping layer may be fusion bonded or adhered to the surface of the window, may be formed on the surface of the window or may be spun coated or spray coated onto the surface of the window.

The grid may be at least partly formed of a liquid and the grid may include a closable port adapted to allow passage of liquid, when open, into and out of the grid during the operational life of the window. The grid may be formed of both liquid and solid, thus a metal or other solid may be deposited so that it is disconnected then connected electrically by flowing liquid through it. Thus, an adaptive window may be created, using this method, having RF/MICROWAVE reflective/absorptive characteristics which are variable according to the liquid forming, or partly forming, the grid at any one time.

The step of treating the material as required to render the grid usable to reduce the RF/MICROWAVE transmission characteristics of the window may comprise solidifying the liquid.

The liquid may be colloidal having particles therein to render the window non transmissive to RF/MICROWAVE radiation and the step of treating the material as required to render the grid usable to reduce the RF/MICROWAVE transmission characteristics of the window may include evaporating off the liquid to leave the said particles within the channels.

The step of evaporating off the liquid may include sealing the colloidal liquid within the channels of the grid, forming a port for evaporation having a size less than the particulate size of the said particles and then evaporating off the liquid through the port.

The step of treating the material as required to render the grid usable to reduce the RF/MICROWAVE transmission characteristics of the window may include covering the channels of the grid and confining the liquid within the covered channels and the step of confining the liquid within the channels may comprise confining an electroless plating solution within the channels and may include the step of electrolessly plating the channels with a metal contained in the solution.

The step of covering the channels of the grid may include growing a layer of protective material over the grid or attaching a protective layer to the surface of the window.

The step of causing a liquid having one of electrically conductive and dielectric properties to RF/MICROWAVE radiation substantially to fill the channels may be carried out after the channels of the grid have been covered and the step of causing the liquid to substantially fill the channels of the grid may thus include introducing the liquid to the grid and continuously making the liquid available to the grid while capillary action draws the liquid throughout the grid. Alternatively or in addition, suction and/or pressure may be applied to the grid to urge or draw the liquid therethrough.

The step of causing a material having one of electrically conductive and dielectric properties to RF/MICROWAVE radiation substantially to fill the channels may include the steps of covering the surface of the window defining the grid with a layer of the liquid to substantially fill the channels of the grid and then wiping the surface of the window whereby to remove the liquid from the surface while leaving the channels of the grid substantially filled with the liquid.

The step of causing a material having one of electrically conductive and dielectric properties to RF/MICROWAVE radiation substantially to fill the channels may include the steps of covering the surface of the window defining the grid with a layer of liquid metal to substantially fill the channels of the grid, allowing the liquid metal to solidify and polishing the surface of the window whereby to remove the metal from the surface while leaving the channels of the grid substantially filled with the metal.

The step of causing a material having one of electrically conductive and dielectric properties to RF/MICROWAVE radiation substantially to fill the channels may include the steps of sputtering over the surface of the window defining the grid a layer of metal to substantially fill the channels of the grid and selectively etching the surface of the window whereby to remove the sputtered metal from the surface while leaving the channels of the grid substantially filled with the metal.

The step of forming on a surface of the window a grid of channels may include forming the grid of channels by laser etching or chemically etching the window material.

The step of forming on a surface of the window a grid of channels may include the following steps: forming a mould in the shape of an EO window, the mould defining a positive grid formation whereby to impart to a moulded window a negative grid formation on one surface of the window, forming a sol of a material suitable for sintering and pouring the sol into the mould, converting the sol to a gel by the application of heat, drying the gel whereby to impart to the gel a permanent shape corresponding to that of the mould, and vitrifying the gel by sintering whereby to form a sintered EO window having the grid of channels formed on one surface thereof.

The step of forming a capping layer for the window may include the following steps: forming a mould in the shape of the layer, forming a sol and pouring the sol into the mould, converting the sol to a gel by the application of heat, drying the gel whereby to impart to the gel a permanent shape reflecting that of the mould, and vitrifying the gel by sintering whereby to form a said capping layer.

BRIEF DESCRIPTION OF THE DRAWINGS

The above and further features of the invention are set forth in the appended claims and will be explained in the following by reference to various exemplary embodiments and the specific examples which are illustrated in the accompanying drawings in which:

FIG. 1 is a sectional schematic view of a portion of EO window according to the invention having a grid embedded therein;

FIG. 2 is a sectional schematic view of a similar window with embedded grid and covered by a capping layer;

FIG. 3 is a flow diagram of the manufacturing steps for making an EO window with an embedded grid and a capping layer, according to the invention;

FIG. 5b is a photograph, to a larger scale, of the grid of FIG. 5a;

FIG. 6b is an enlarged photograph of the grid of FIG. 6a;

FIG. 6c is an optical micrograph of a cross section of the channels of FIG. 6a;

DETAILED DESCRIPTION

Figure 4:
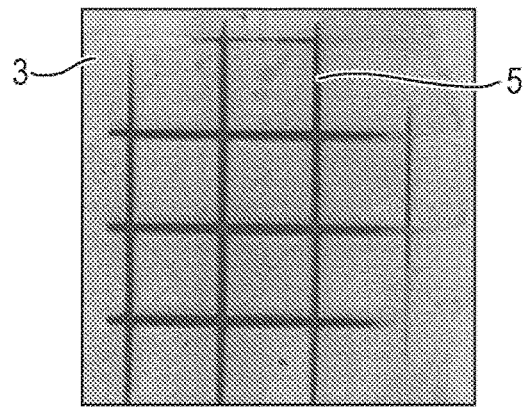
FIG. 4 is a photograph of a glass wafer, laser etched with channels 2 μm wide and deep.

Optically suitable materials for an EO window according to the invention are well-known. Work has been done by the inventors on sapphire (aluminium oxide, Al2O3) and spinel (magnesium aluminium oxide, MgAl2O4).

Synthetic sapphire can be grown in several of its crystal orientations including the "A", "C", "R" and "M" plane. For EO window applications the 'C' or 'A' plane axes may be used.

Sapphire crystals are grown using a variety of crystal growth techniques and then machined and polished into the finished window geometry. Sapphire can be processed to a very high optical specification of flatness and surface quality. For example, scratch/dig (S/D) of 20/10 can be achieved for flatness of λ/4, which is suitable for almost all optical applications.

Magnesium aluminate or magnesium aluminium oxide, or spinel, is a durable polycrystalline transparent ceramic. Spinel blanks may be made using conventional ceramic processing techniques. A powder of the raw constituent materials is prepared (usually to a proprietary formulation), compacted and can be dry-isostatically pressed, slip cast or injection moulded into the required shape. This is followed by a heat treatment to densify the material. The blanks may then be ground and polished to specification.

Spinel can also be produced by crystal growth methods, chemical vapour deposition and chemical synthesis routes, including sol gel synthesis, as described below.

Sapphire is currently available as follows:—
Max. planar dimension: 300 mm×500 mm or 225 mm×660 mm;
Ratio of thickness to planar length required for polishing: 1:70;
Min. thickness required for optical polishing & processing: 7 mm;
Max. thickness available: 7.7 mm.

Spinel is currently available as follows: —
Max. planar dimension: 300 mm×460 mm;
Ratio of thickness to planar length required for polishing: 1:35-1:10;
Min. thickness required for optical polishing & processing: 13-40 mm;
Max. thickness available: 25 mm.

For reasons of commercial availability only, the EO window was made of sapphire or spinel, between 5-20 mm thick, with a planar edge of 300-500 mm.

Because a grid that is on the surface of the window will be exposed to abrasion and erosion, it will need protection. Protection may be imparted by adding protective coatings. Referring to FIG. 1, an embodiment of the invention is shown. Here, a sub-surface grid 1 is shown flush with a surface 2 of a window 3; the grid 1 is positioned within the window 3 rather than on it. This reduces the exposure of the grid to impacts and abrasion and still renders electrical connection to the grid very accessible.

FIG. 2 shows a further embodiment with a grid 1 completely protected from the elements. The grid 1 is located, as in FIG. 1, within the window 3. In addition, both the grid 1 and the upper surface 2 of the window are covered with a capping layer 4. This design will completely protect the grid from a harsh aerospace environment. It will be noted that electrical connection to the grid 1, in this embodiment, is through the exposed cross-section of the embedded grid. However, electrical connection can be made through vias from the back of the window or from top or edge surfaces, with bus bars or electrical connections surrounding the edge. For use on aircraft, it may be also be important to connect electrically to airframe window surrounds, for metal grids at least.

The flow diagram of FIG. 3 shows the manufacturing steps required to make a window according to the invention, by two alternative routes. On the left side of the diagram, is shown one route, on the right, another. Looking at the left side, channels 5 of a grid are etched into a surface 2 of a sapphire or spinel window 3 by any suitable etching process. The channels 5 are then metallized, again, by any suitable process. Following this step, capping layer 4 which may also be of spinel or of another suitably hard material having transparent properties, is attached to the upper surface 2 of the window 3 by one of several methods described below.

Following the right side of the diagram, an alternative method is shown where, following etching of the channels 5, the capping layer 4 is immediately attached to the window, followed by metallisation, again, as further described below.

In an example, according to the invention, a grid has been etched in a window using a laser system suitable for both glass and sapphire substrates. The laser etching system uses a 200 KHz pulsed excimer laser with a 193 nm lens and a chrome on quartz mask of the required grid. A glass wafer etched by this method is shown in FIG. 4. This technique is also applicable to etching spinel.

This method of etching has potential to be scaled up, but this may be at significant cost. The throughput of such a process may be of the order of ~10 mm/s. Vacuum processing techniques have been developed for achieving mirror finishes on laser etched arrays.

Figure 5A:
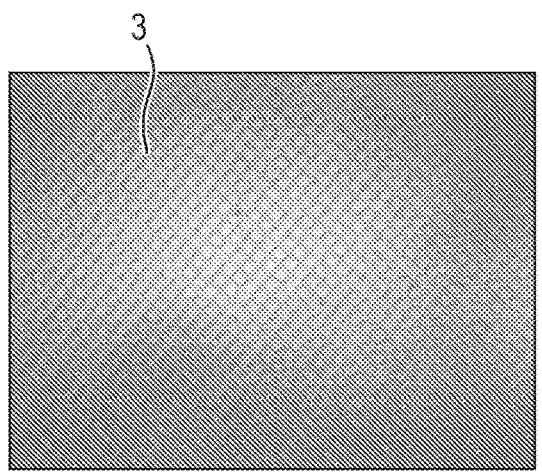
FIG. 5a is a photograph of a chemically etched grid of channels on a glass wafer.
Figure 5B:
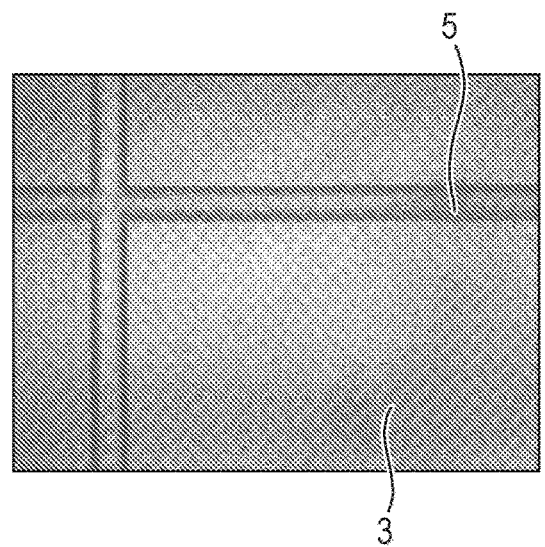
Figure 5C:
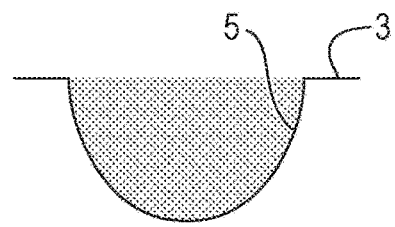
FIG. 5c is a schematic cross sectional view of a channel.

Chemical etching has also been used to etch glass wafers, see FIGS. 5a, b and c, and may be used according to the invention to etch sapphire. The channels 5 are 3 μm deep, 7 μm wide and with a 100 μm separation.

Work has been carried out to research the deposition of metal into surface channels. Many materials are suitable for use as RF/MICROWAVE reflector fillers for the grid channels. Most metals and many alloys are suitable. Gold, silver, aluminium, platinum and the refractory metals are suitable, as are iron, cobalt, nickel and many fluids.

Figure 6A:
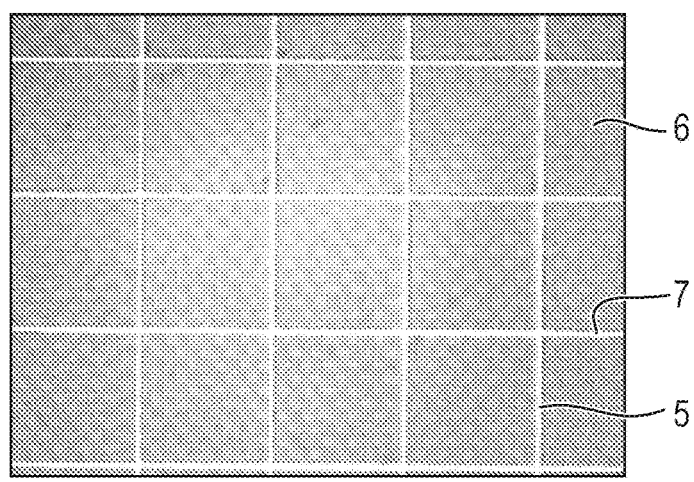
FIG. 6a is a photograph of a glass sample having a grid of channels, the sample having been selectively etched to leave metal within the channels of the grid.
Figure 6B:
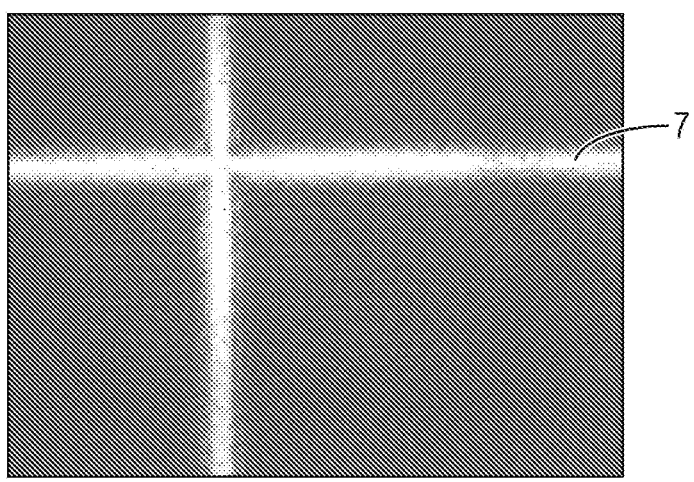

In an example, aluminium was sputtered over a gridded sample 6 and then selectively etched to leave metal 7 within the channels 5 of the grid 1, see FIGS. 6a and 6b.

Figure 6C:
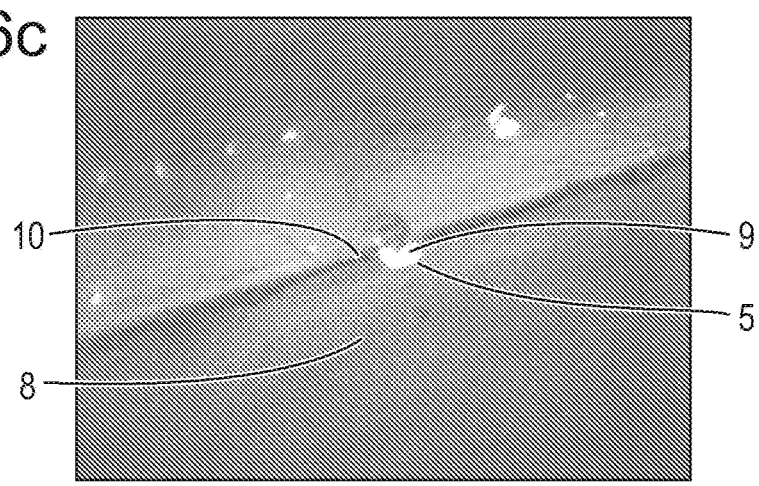

Cross sectional image analysis of this sample was used to evaluate the channel metallisation, see FIG. 6c. A channel 5 in the glass 8 is filled with aluminium 9. The initial channel 5 was 7 μm wide and 3 μm in depth. Variability across the grid can lead to over etched patches of metal. To mitigate this, the grid channels 5 were deepened to ensure the grid could be etched back from the surface 10 without affecting the continuity of the grid.

Figure 7:
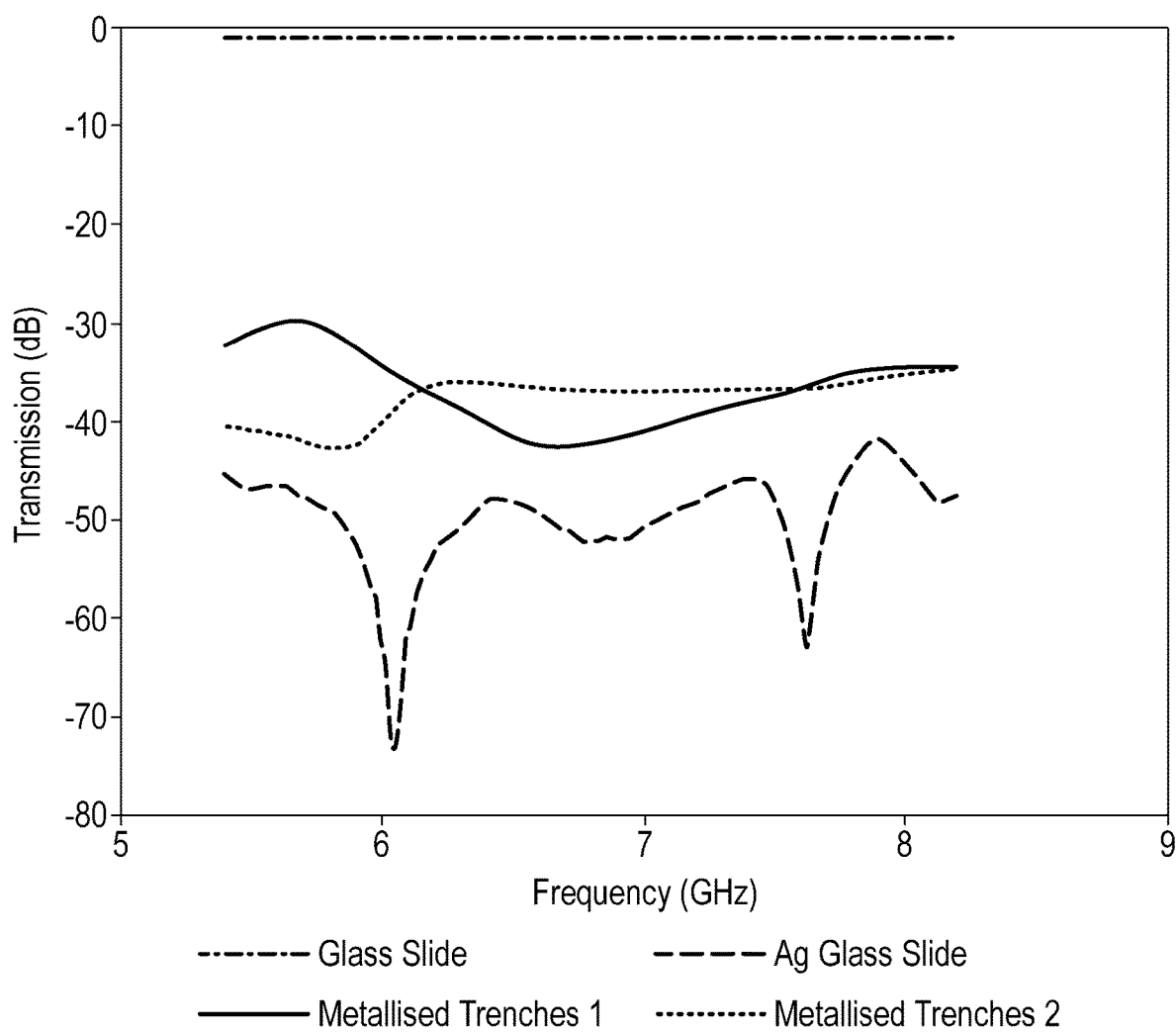
FIG. 7 is a graph showing microwave transmission of metallized surfaces and metallized grids.

The microwave reflectivity of the samples were characterised and the results are shown in FIG. 7. The results indicate that sputtered layers of metal just a few microns thick and electrolessly plated metal layers of the order of a micron thick have a high enough conductivity to provide significant radar reflection. The use of electroless plating to generate a grid is described in the following section.

An electroless gold plating process occurs in the liquid phase at elevated temperatures (~50 C). Therefore it is important that the electroless solution is contained, to avoid evaporation during heating. In order to achieve this, a section of pre-cavitated glass wafer was placed face down (cavities side down) on a glass slide. The electroless gold plating solution was introduced to the edge of the wafer section by pipette and was observed to be drawn into the channels by capillary action. Once the sample was fully wetted with plating solution it was placed in an oven at 50 C for ~15 minutes to activate the plating process. The wafer section was removed from the carrier slide and examined. A thin layer of gold was seen to be plated across the entire top surface of the wafer (visible as a transparent purple film) in addition to the metal filling the trenches. The surface gold film was wiped off leaving the metal in the trenches intact.

The present invention is partly concerned with methods of forming metal coatings within channels embedded within window structures.

Optically transparent spinel is manufactured using ceramic processing techniques.

A metallic mesh or conductive grid may be embedded within the window during manufacture by embedding a mesh of a sacrificial material in any suitable window bulk material. Examples of suitable sacrificial materials are: polymers, some low melting-point metals, eutectics, carbon nanotubes, and wax. The mesh or grid is then removed by, for example, melting the sacrificial material to leave a grid of channels in the manufactured window for receiving a conductive or dielectric grid, as desired, for use in operation.

Figure 8A:
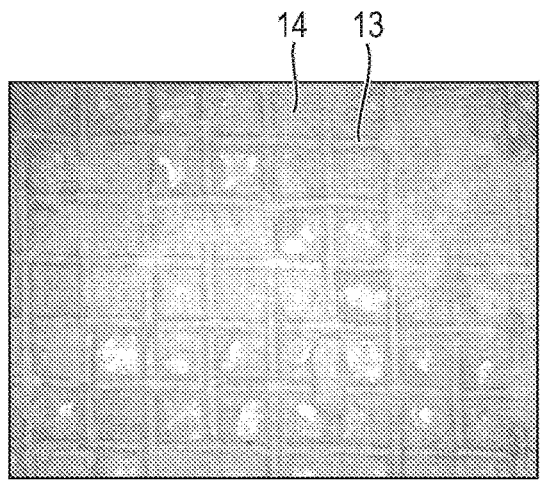
FIG. 8a is an Image of a free standing mesh pressed into the surface of a pre-sintered ceramic compact.
Figure 8B:
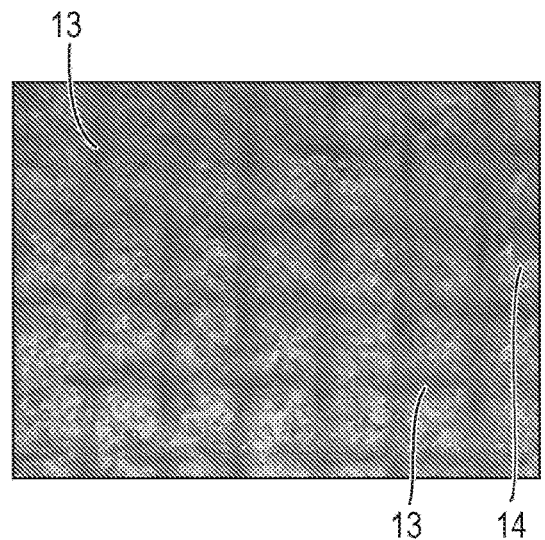
FIG. 8b is an image of the sintered ceramic of FIG. 8a with residual grid impression.

As illustrated on an opaque ceramic 14 in FIGS. 8a and 8b, it is also possible to use free standing meshes to create a grid image 13 within the pre-sintered compressed ceramic 14 and to fire the ceramic to form a grid 13 in the surface of the fired ceramic 14 that may then be filled with conductive or resistive materials. In principle, this is applicable to spinel using a similar process.

Figure 9A:
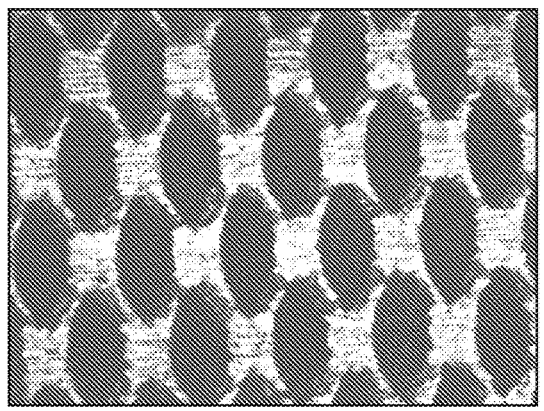
FIGS. 9a and 9b are images of carbon based fillers being introduced into pre-sintered compressed ceramic.
Figure 9B:
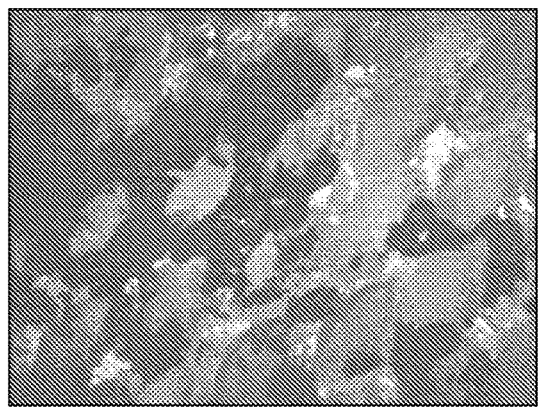

It is also possible to use this technique to form a resistive or absorbing grid from carbon based materials such as carbon powders or nanotubes. FIGS. 9a and 9b illustrate forming, with an expanded metal foil, see FIG. 9a, subsurface carbon grids in a pre-sintered ceramic compact. Carbon particles or nanotubes can then be distributed in the grid channels as required and the ceramic sintered. FIG. 9b illustrates the result, with carbon residing in the channels.

Examples of absorptive materials include ferrites such as nickel zinc, manganese zinc and cobalt ferrites; magnetites; ceramics, and carbon based materials as above.

Fluids may also be used to form the grid material, in use. Examples are: electrolyte solutions, such as potassium ferrocyanate; ethylene glycol; methanol, and acids. Colloids such as magnetic colloids like ferro-fluids are also suitable to act as the grid material. Spinel can be made using sol gel techniques, allowing for optically transparent thin films to be synthesized. These may be used to protect surface or sub-surface grids.

Conventionally, spinel films are deposited using chemical vapour deposition methods but that method is presently limited to relatively small areas (a few $cm^2$). According to the present invention, the use of sol gel methods for manufacturing large area capping layers of spinel is proposed.

It is known that mixtures of salts of magnesium and aluminium in the appropriate ratio decompose at high temperatures to produce spinel and the method is often used to manufacture powders of spinel.

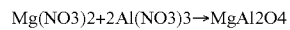

$Mg(NO3)2 + 2Al(NO3)3 \rightarrow MgAl2O4$

Figure 10A:
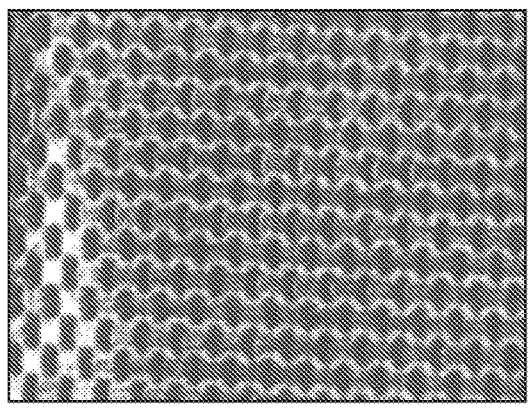
FIG. 10a is an image of a copper foil upon which to cast a silica gel.
Figure 10B:
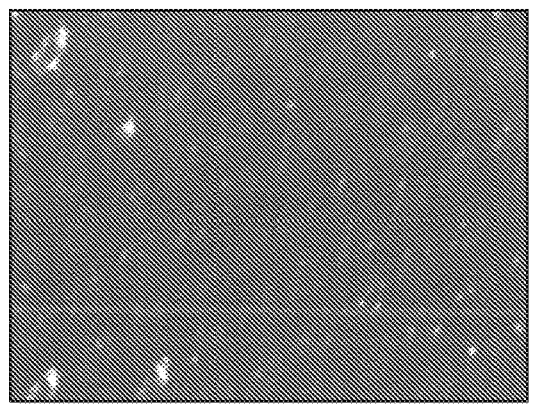
FIG. 10b is a micrograph of a resulting sintered body with the features of the copper foil.

Studies were initially undertaken using silica, rather than spinel because of the simpler chemistry involved. A thin film of a silica gel was cast onto a perforated copper foil, see FIG. 10a. When the gel was partially dry, and shrinkage was minimal, the film was removed from the foil and then dried and sintered. The final body, although dimensionally smaller, showed the features of the original green body, see FIG. 10b. Thus, this technique may be adopted for the manufacture of EO windows with grid channels set into one surface thereof.

Figure 11A:
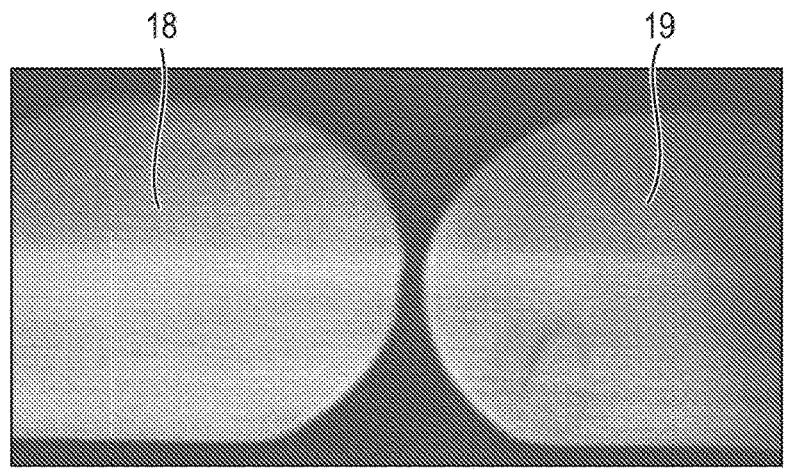
FIG. 11a is an image of coated and uncoated Si wafers.
Figure 11B:
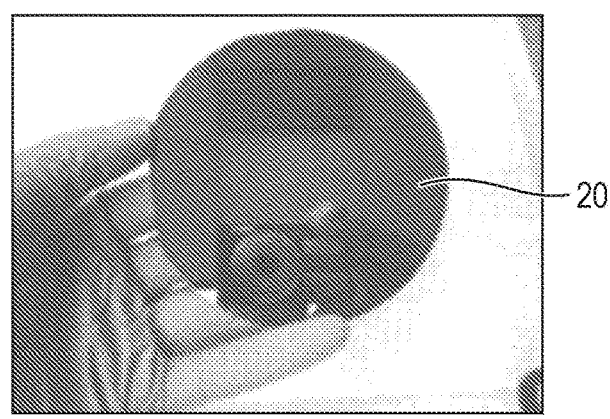
FIG. 11b is an image of a coated wafer after high temperature processing.
Figure 12:
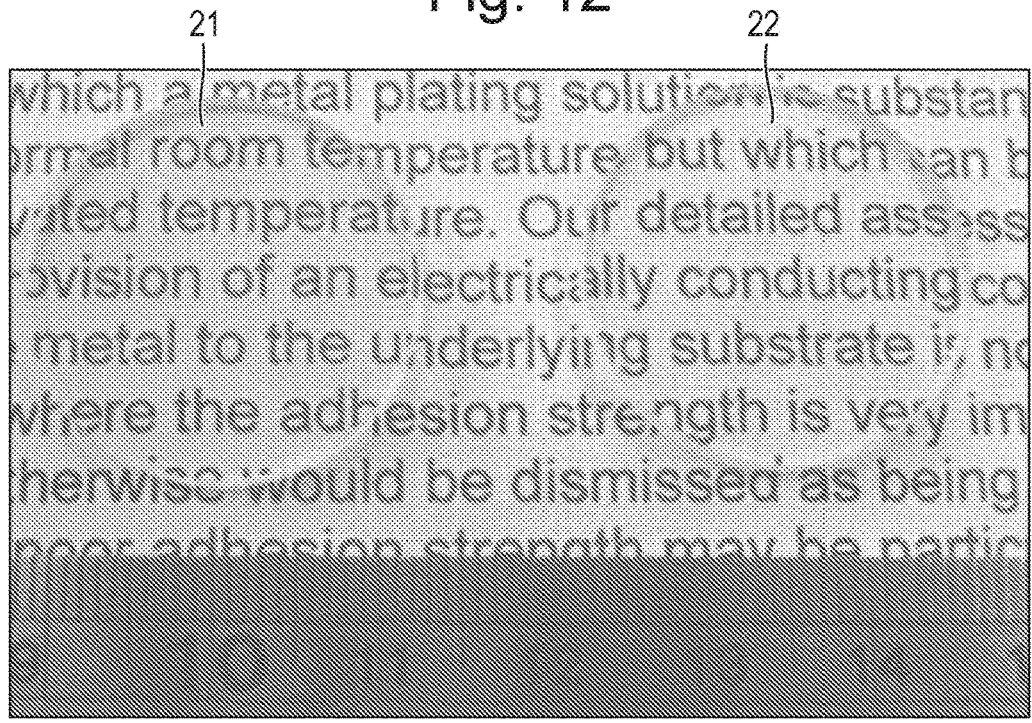
FIG. 12 is an image of coated and uncoated sapphire windows.
Figure 13A:
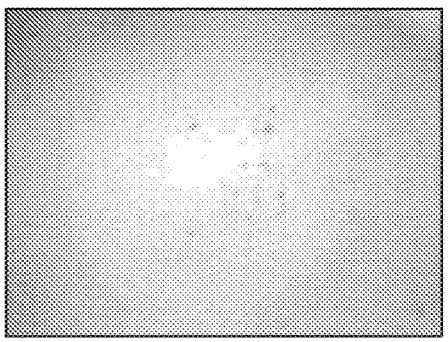
FIGS. 13a, 13b and 13c are optical microscope images (20× mag.) of films prepared from precursors with various polymers.
Figure 13B:
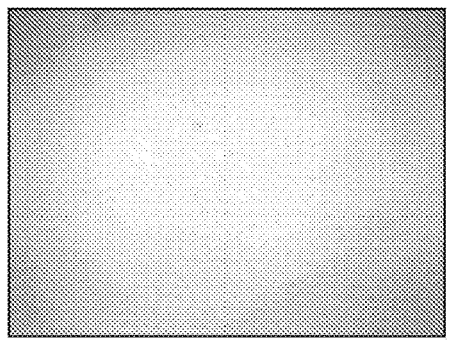
Figure 13C:

For spin coating of spinel, methanolic solutions of the mixed metal nitrates were spun onto substrates (glass slides, silicon wafer and sapphire windows). It was found that the addition of a very small amount of a suitable polymer led to excellent film formation after spin coating, and the films remained intact and continuous after low temperature drying to remove solvent and subsequent high temperature thermal treatment. The choice of polymer was found to be very important and certain polymers were more suitable than others for ensuring good quality film formation. FIGS. 11a and 11b show examples of good continuous solvent free films of mixed metal nitrates on silicon wafer substrates produced by spin coating. In FIG. 11a, an uncoated Si wafer 18 is shown on the left and a spin coated and dried wafer 19, on the right. FIG. 11b shows a coated wafer 20, after high temperature processing. FIG. 12 shows sapphire windows before and after coating and subsequent heat treatment, with 21 being an uncoated sapphire window and 22 being a sapphire window having a spin coating of mixed Mg and Al nitrates, with polymer. FIGS. 13a, b and c show the importance of the choice of polymer for aiding film formation. Here, FIGS. 13a and 13b show films prepared from a precursor with a good choice of polymer and FIG. 13c shows film prepared from a poor choice of polymer where the nitrates have crystallised from solution.

Figure 14A:
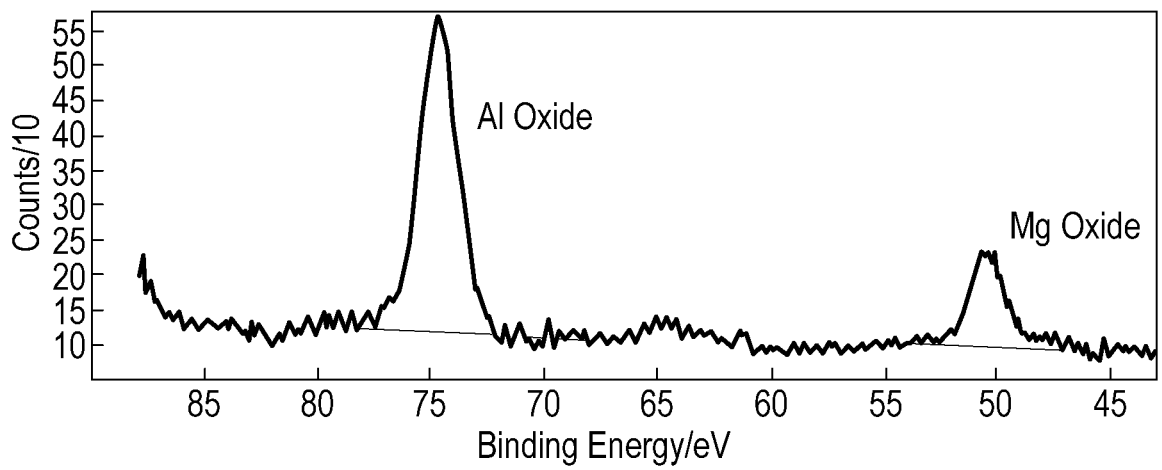
FIG. 14a is a graph showing XPS analysis of the coating on a Si wafer.
Figure 14B:
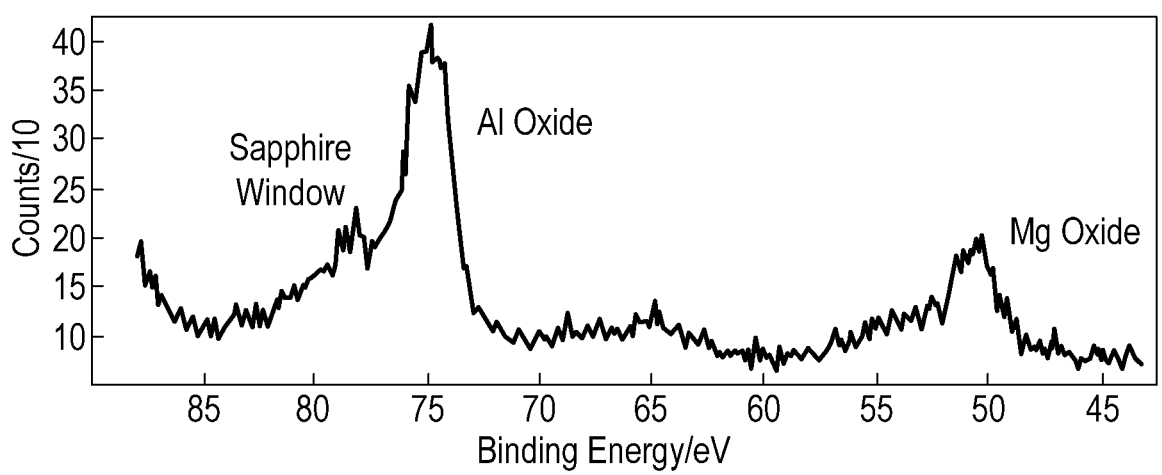
FIG. 14b is a graph showing XPS analysis of the coating on a sapphire window.

XPS (x-ray photoelectron spectroscopy) analysis of coatings deposited on silicon wafers and sapphire windows confirms the presence of magnesium oxide and aluminium oxide, see FIG. 14a and FIG. 14b.

TABLE 1

| | eV | Assignment | On wafer | On sapphire disc |
|---|---|---|---|---|
| Carbon | 284.9 | Hydrocarbon | 22.9% | 16.8% |
| Oxygen | 531.2 | Inorganic oxide | 47.3% | 51.57% |
| Aluminium | 74.6 | Al oxide | 20.2% | 22.9% |
| Magnesium | 50.5 | Mg oxide | 9.7% | 8.7% |

Figure 15:
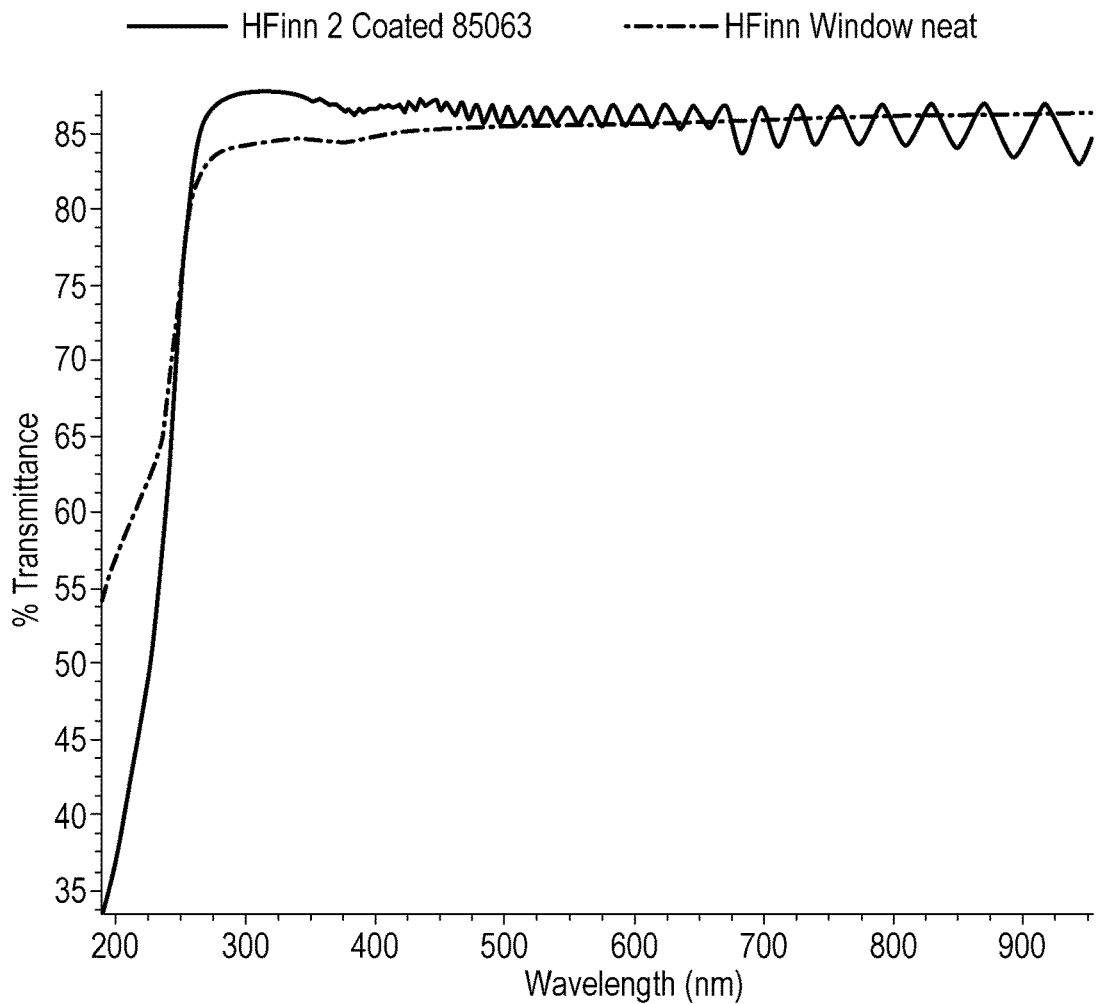
FIG. 15 is a graph showing UV/Vis spectra of an uncoated sapphire window and a spinel coated sapphire window.

Quantitative analysis of the composition of the coating on silicon shows that the ratio of magnesium to aluminium (as oxide) is the expected 1:2, see Table 1, above. The ratio of the coating on the sapphire window shows a higher amount of aluminium but this is to be expected because of contributions from the aluminium oxide present in the structure of the sapphire substrate, see FIG. 15.

Comparison of an uncoated sapphire window and sapphire window that has been spin coated with the precursor mixture followed by thermal treatment reveals only small differences in the transmission window. The uncoated window transmits ~85% of light from 1100 nm to ~270 nm at which point the transmission falls rapidly to ~55% at 190 nm. Transmission through a spinel coated sample has similar transmission from 100 nm to ~270 nm but thereafter the fall in transmission is faster than in the control sample and the final transmission is ~35% at 190 nm, see also FIG. 15.

Figure 16:
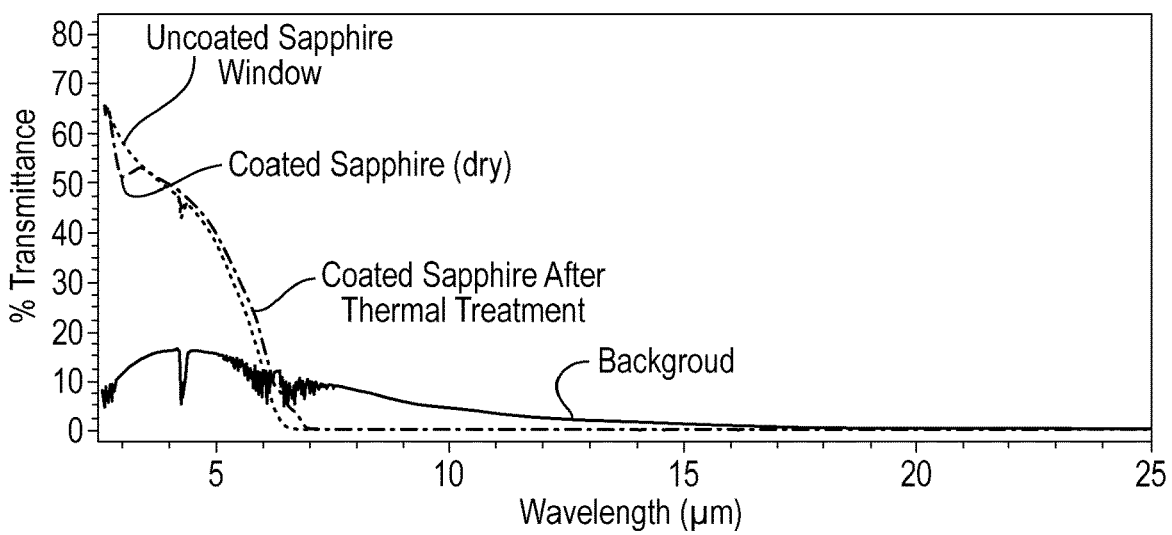
FIG. 16 is a graph comparing the transmission or IR through an uncoated sapphire window, a dried film of precursor material on a sapphire window and the same window following thermal treatment.

FIG. 16 shows the IR transmission spectra of an uncoated sapphire window, a sapphire window coated with the dried precursor and the same window after full thermal treatment. The transmission window for all samples is ~3 µm to 5 µm and at 5 µm and higher the transmission is essentially zero. The OH stretch arising from the presence of a polymer can clearly be seen. This absorption band disappears following thermal treatment. The presence of the final coating does not significantly attenuate transmission in the 3 to 5 µm band. In all samples transmission falls below ~50% at ~4 µm. Thus, there is little degradation in the optical and IR transmission spectra of a capped window.

Figure 17A:
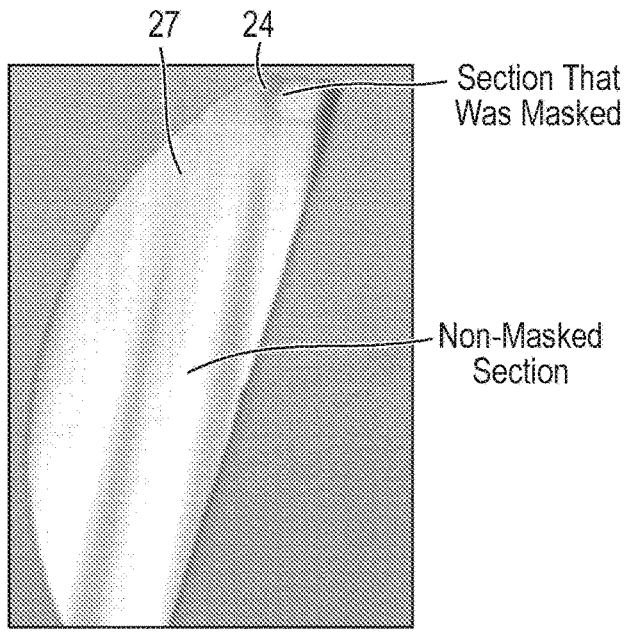
FIG. 17a is an image showing light reflected from a section of Si wafer spray coated with spinel precursor & dried at 70° C.
Figure 17B:
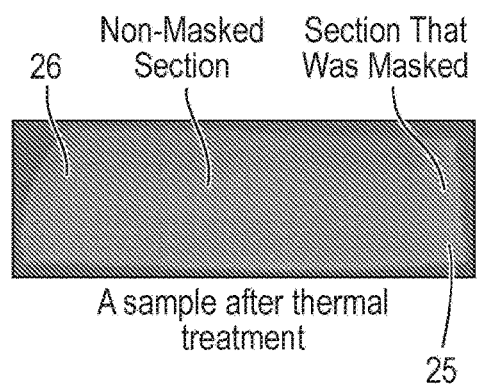
FIG. 17b is an image of such a sample after thermal treatment.

For large substrates spin coating may not be appropriate, thus deposition of magnesium aluminate films using spray techniques was investigated. Modification of the spin coating precursor for spinel, used above, produced a mixture that could be sprayed onto substrates (glass, and silicon wafers). Visual inspection by eye and under an optical microscope showed the wet, (as deposited) film and the dried film to be fairly uniform. FIG. 17a shows an example of a coated Si wafer 23, a portion 24 of which was masked off prior to spray coating and FIG. 17b shows a sample having a masked portion 25 and an unmasked portion 26 that has subsequently undergone full thermal treatment.

Fusion bonding is a method of joining materials including ceramics to each other through the application of pressure and heat without the use of adhesives. It has been successfully used by the inventors on several materials such as silicon and glass to form strong bonds. If fusion bonding is possible with gridded windows, then grids could potentially be protected by a layer of the substrate material without a glue line. Such glue lines can severely compromise the optical and mechanical properties of the structure. Fusion bonding can create optically transparent bonds under the right conditions.

Fusion bonding requires flat, clean surfaces. The surfaces are mated under pressure and at elevated temperatures. The surfaces of the material are prepared using a proprietary process to degrease, clean and chemically activate the surface of a wafer. The surfaces are then bonded using wafer bonding equipment and post treated in a vacuum oven.

Figure 18:
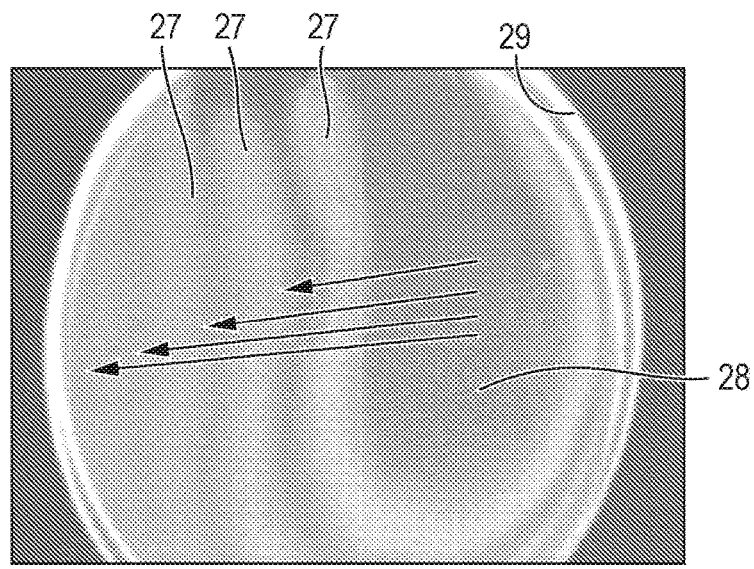
FIG. 18 is an image of a pair of sapphire windows fusion bonded together, showing Newton's rings.

The bonding process has been demonstrated on a pair of sapphire windows, as shown in FIG. 18. Interferences fringes 27 (known as Newton's rings) indicate there is a bond gap; the gap can be estimated using the separation between the interference fringes, as indicated by the tips of the arrows.

Analysis of the fringes indicated a gradual separation between the windows from a successful fusion bond at a clear part 28 of the sample to ~1 µm separation between the windows at the edge 29 of the sample. The specification of these windows has a flatness of 2λ over the 20 mm window. Generally, for fusion bonding, a flatness of λ/10 over 50 mm would be necessary for a good fusion bond. The defect in the bond is probably due to a variation in flatness across the window samples.

From the above it is concluded that fusion bonding techniques may be used to create a window according to the invention with an embedded grid by fusion bonding a capping layer onto the gridded window.

Figure 19:
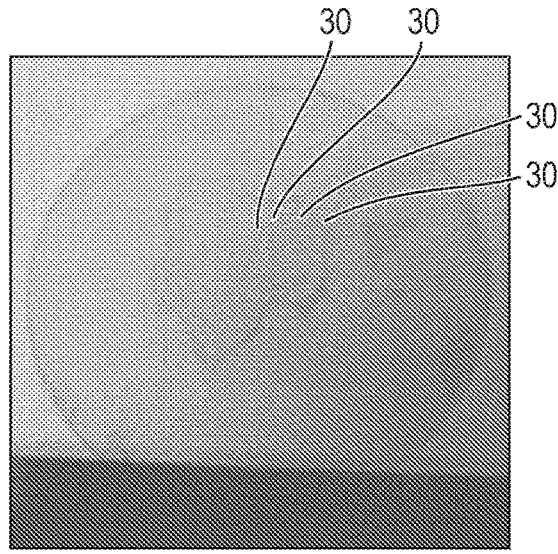
FIG. 19 is an image of two fusion bonded glass wafers, one having a grid on the surface thereof.

A gridded pattern was etched into a glass wafer and a second glass wafer was fusion bonded onto the surface. An image of the resulting structure is shown in FIG. 19. The interference fringes 30 indicate the central area has not properly bonded.

Figure 20A:
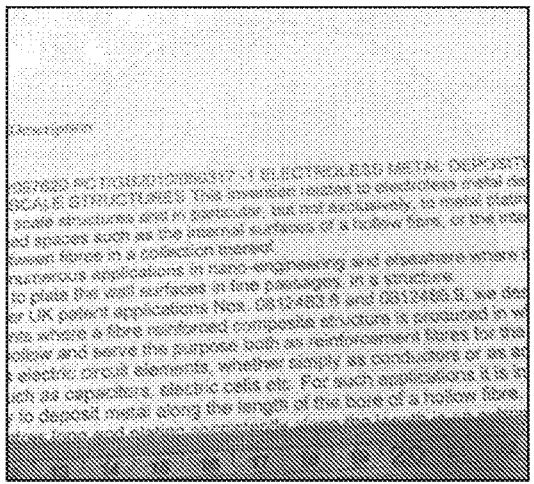
FIG. 20a shows the optical transmission through the two fusion bonded glass wafers of FIG. 19.
Figure 20B:
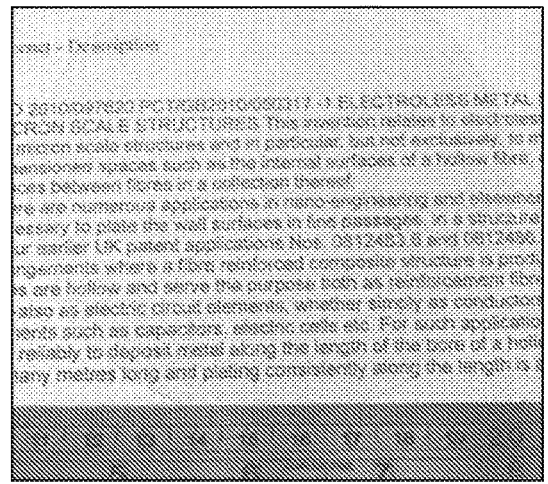
FIG. 20b shows the optical transmission through a pair of adhesively bonded wafers.
Figure 21:
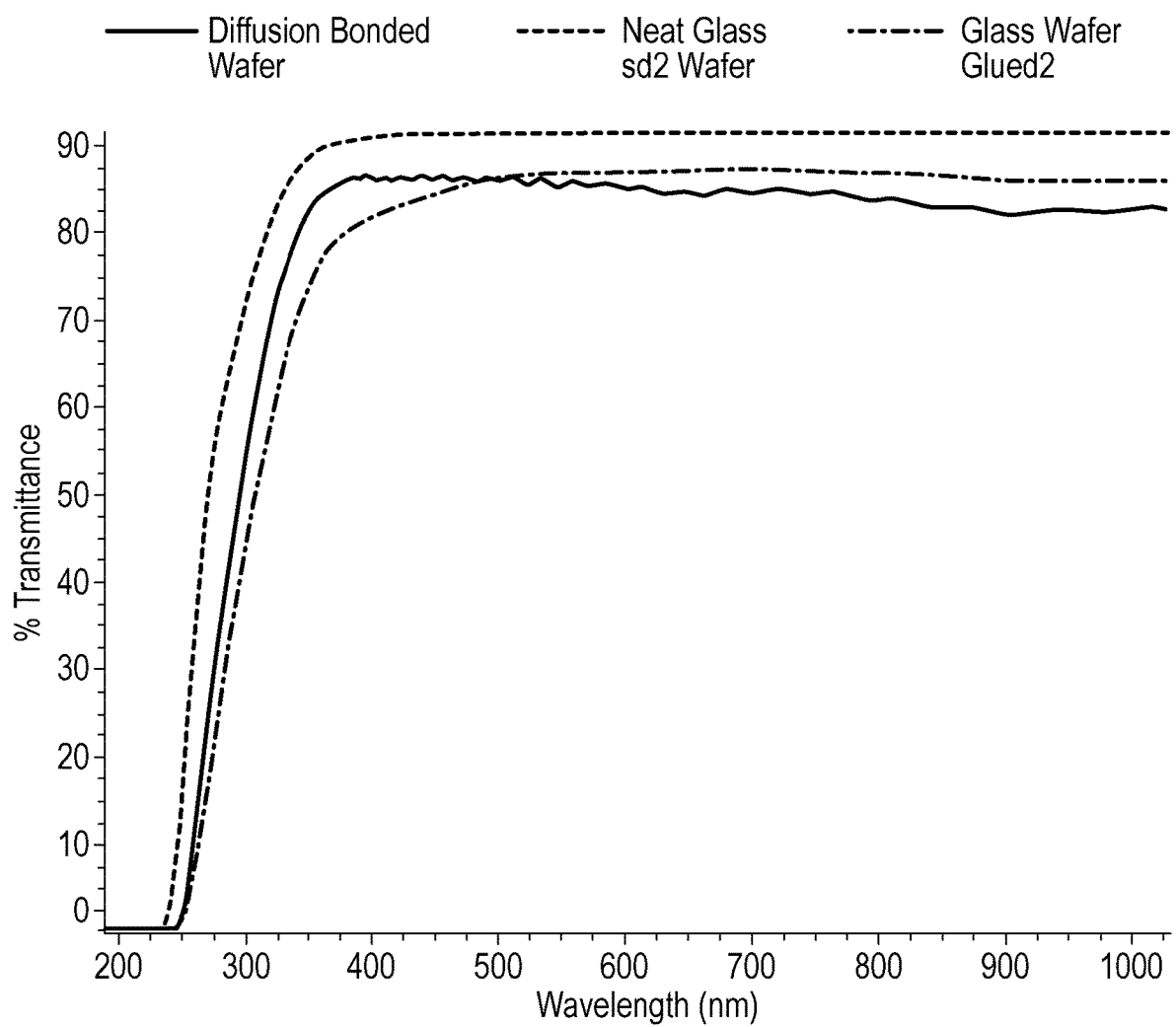
FIG. 21 is a graph comparing the optical transmission spectra of various samples.

The optical transmission through this sample, see FIG. 20a, is compared to an adhesively bonded wafer, see FIG. 20b, and the IR transmission of the samples is compared to an untreated glass wafer in FIG. 21.

What is claimed is:

1. A method of making an electro-optic window having reduced RF and microwave transmission characteristics, the method comprising:
   providing a window that is formed from a material that is substantially transparent to at least one of infra-red, visible and UV radiation;
   forming on a surface of the window a grid of channels;
   sputtering over the surface of the window a layer of a material having one of electrically conductive and dielectric properties to substantially fill the channels of the grid;
   selectively etching the surface of the window, thereby removing the sputtered material from the surface while leaving the channels of the grid substantially filled with the material, creating a corresponding grid pattern of the material within the channels, and thereby rendering the window non transmissive to RF/MICROWAVE radiation; and
   treating the material as required to render the grid usable to reduce the RF/MICROWAVE transmission characteristics of the window.

2. The method according to claim 1, wherein the material is a metal.

3. The method according to claim 1, wherein the step of forming on a surface of the window a grid of channels comprises forming the grid of channels by laser etching the window material.

4. The method according to claim 1, wherein the step of forming on a surface of the window a grid of channels comprises forming the grid of channels by chemically etching the window material.

5. The method according to claim 1, wherein the step of forming on a surface of the window a grid of channels comprises:
   forming a mould in the shape of an EO window, the mould defining a positive grid formation whereby to impart to a moulded window a negative grid formation on one surface of the window;
   forming a sol of a material suitable for sintering and pouring the sol into the mould;
   converting the sol to a gel by the application of heat;
   drying the gel whereby to impart to the gel a permanent shape corresponding to that of the mould; and
   vitrifying the gel by sintering whereby to form a sintered EO window having the grid of channels formed on one surface thereof.

6. The method according to claim 1, further comprising a step of forming a capping layer configured to cover the grid and attach to the window surface by:
  forming a mould;
  forming a sol and pouring the sol into the mould;
  converting the sol to a gel by the application of heat;
  drying the gel whereby to impart to the gel a permanent shape reflecting that of the mould; and
  vitrifying the gel by sintering whereby to form a said capping layer.

* * * * *